United States Patent
Lofgren et al.

(10) Patent No.: US 6,230,233 B1
(45) Date of Patent: May 8, 2001

(54) WEAR LEVELING TECHNIQUES FOR FLASH EEPROM SYSTEMS

(75) Inventors: Karl M. J. Lofgren, Newport Beach; Robert D. Norman, San Jose; Gregory B. Thelin, Garden Grove; Anil Gupta, Irvine, all of CA (US)

(73) Assignee: Sandisk Corporation, Santa Clara, CA (US)

( * ) Notice: Subject to any disclaimer, the term of this patent is extended or adjusted under 35 U.S.C. 154(b) by 0 days.

(21) Appl. No.: 07/759,212

(22) Filed: Sep. 13, 1991

(51) Int. Cl.$^7$ ............................. G06F 12/02; G06F 12/16; G06F 12/10
(52) U.S. Cl. ...................... 711/103; 711/203; 365/185.3; 365/185.33
(58) Field of Search ................................. 364/200, 900; 395/400, 425; 365/185, 189, 200, 218, 900, 185.3, 185.33; 371/10.1, 10.2, 11.1, 21.4; 711/103, 203

(56) References Cited

U.S. PATENT DOCUMENTS

| | | | |
|---|---|---|---|
| 4,093,985 | * | 6/1978 | Das ........................................... 714/5 |
| 4,430,727 | * | 2/1984 | Moore et al. ........................ 711/115 |
| 4,528,683 | | 7/1985 | Henry .................................. 377/24.1 |
| 4,530,054 | | 7/1985 | Hamstra et al. ...................... 711/133 |
| 4,562,532 | * | 12/1985 | Nishizawa et al. .................. 711/170 |
| 4,563,752 | | 1/1986 | Pelgrom et al. .......................... 711/4 |
| 4,608,671 | * | 8/1986 | Shimizu et al. ................. 365/189.05 |
| 4,612,640 | | 9/1986 | Mehrotra et al. .................... 714/766 |
| 4,616,311 | * | 10/1986 | Sato ..................................... 711/206 |
| 4,638,457 | | 1/1987 | Schrenk .......................... 365/189.01 |

(List continued on next page.)

FOREIGN PATENT DOCUMENTS

| | | |
|---|---|---|
| 3200872 | 7/1983 | (DE) . |
| 0349775 | 1/1990 | (EP) . |
| 0392895 | 10/1990 | (EP) . |
| 0398654 | 11/1990 | (EP) . |
| 0424191A2 | 4/1991 | (EP) . |

(List continued on next page.)

OTHER PUBLICATIONS

Bonner, Bruce, "Flash Memory for Top Speeds in Mobile Computing Applications" Computer Technology Review, vol. 12, No. 7, Jun. 1992, pp. 36–37.

Williams John G., "Asymmetric Memory Hierarchies", Communications of the Association for Computing Machinery, vol. 16, No. 4, Apr. 1973, pp. 213–222.

Boxer Aaron, "Where Buses Cannot Go", IEEE Spectrum, pp. 41–45, Feb. 1995.

Torelli et al. "An Improved Method for Programming a Word–Erasable EEPPROM," *Alta Fequenza* vol. 52, Nov. 1983, pp. 487–494.

Lahti & McCarron, "Store Data in a Flash," *BYTE*, Nov. 1990, pp. 311–313, 315 & 317–318.

(List continued on next page.)

*Primary Examiner*—Reginald G. Bragdon

(57) ABSTRACT

A mass storage system made of flash electrically erasable and programmable read only memory ("EEPROM") cells organized into blocks, the blocks in turn being grouped into memory banks, is managed to even out the numbers of erase and rewrite cycles experienced by the memory banks in order to extend the service lifetime of the memory system. Since this type of memory cell becomes unusable after a finite number of erase and rewrite cycles, although in the tens of thousands of cycles, uneven use of the memory banks is avoided so that the entire memory does not become inoperative because one of its banks has reached its end of life while others of the banks are little used. Relative use of the memory banks is monitored and, in response to detection of uneven use, have their physical addresses periodically swapped for each other in order to even out their use over the lifetime of the memory.

33 Claims, 5 Drawing Sheets

U.S. PATENT DOCUMENTS

| | | | |
|---|---|---|---|
| 4,663,770 | 5/1987 | Murray et al. | 377/28 |
| 4,682,287 | 7/1987 | Mizuno et al. | 702/165 |
| 4,718,041 | 1/1988 | Baglee et al. | 365/185.22 |
| 4,803,707 | 2/1989 | Cordan, Jr. | 377/24.1 |
| 4,899,272 | 2/1990 | Fung et al. | 365/230.03 |
| 4,922,456 | 5/1990 | Naddor et al. | 365/185.24 |
| 4,924,375 | 5/1990 | Fung et al. | 711/157 |
| 4,943,962 | 7/1990 | Imamiya et al. | 365/230.08 |
| 4,947,410 | 8/1990 | Lippmann et al. | 377/26 |
| 4,953,073 | 8/1990 | Moussouris et al. | 700/17 |
| 5,034,926 | 7/1991 | Taura et al. | 365/185.14 |
| 5,043,940 | 8/1991 | Harari | 365/185.03 |
| 5,053,990 | 10/1991 | Kreifels et al. | 711/103 |
| 5,065,364 | 11/1991 | Atwood et al. | 365/185.13 |
| 5,095,344 | 3/1992 | Harari | 257/328 |
| 5,103,411 | 4/1992 | Shida et al. | 377/24.1 |
| 5,134,589 | 7/1992 | Hamano | 365/238.5 |
| 5,138,580 | 8/1992 | Farrugia et al. | 365/185.22 |
| 5,155,705 | 10/1992 | Goto et al. | 365/218 |
| 5,163,021 | 11/1992 | Mehrotra et al. | 365/185.03 |
| 5,168,465 | 12/1992 | Harari | 257/320 |
| 5,172,338 | 12/1992 | Mehrotra et al. | 365/185.03 |
| 5,193,071 | 3/1993 | Umina et al. | 365/189.01 |
| 5,210,716 * | 5/1993 | Takada | 365/185.09 |
| 5,222,109 * | 6/1993 | Pricer | 377/24.1 |
| 5,245,572 | 9/1993 | Kosonocky et al. | 365/185.11 |
| 5,263,003 | 11/1993 | Cowles et al. | 365/230.03 |
| 5,267,218 | 11/1993 | Elbert | 365/185.04 |
| 5,268,870 | 12/1993 | Harari | 365/185.09 |
| 5,270,979 | 12/1993 | Harari et al. | 365/185.09 |
| 5,272,669 | 12/1993 | Samachisa et al. | 365/185.3 |
| 5,280,447 | 1/1994 | Hazen et al. | 365/185.11 |
| 5,295,255 | 3/1994 | Malecek et al. | 711/1 |
| 5,297,148 | 3/1994 | Harari et al. | 714/710 |
| 5,303,198 * | 4/1994 | Adachi et al. | 365/185.11 |
| 5,341,489 | 8/1994 | Heiberger et al. | 365/185.11 |
| 5,357,473 | 10/1994 | Mizuno et al. | 365/201 |
| 5,371,876 | 12/1994 | Ewertz et al. | 711/159 |
| 5,388,083 | 2/1995 | Assar et al. | 365/185.33 |
| 5,430,859 | 7/1995 | Norman et al. | 711/103 |
| 5,544,118 | 8/1996 | Harari | 365/218 |
| 5,548,554 | 8/1996 | Pascucci et al. | 365/200 |
| 5,630,093 | 5/1997 | Holzhammer et al. | 711/115 |
| 5,663,901 | 9/1997 | Wallace et al. | 365/52 |
| 5,726,937 | 3/1998 | Beard | 365/185.33 |
| 6,081,447 | 6/2000 | Lofgren et al. | 365/185.02 |

FOREIGN PATENT DOCUMENTS

| | | |
|---|---|---|
| 0492106 | 7/1991 | (EP) . |
| 0522780 | 1/1992 | (EP) . |
| 0569040 | 11/1993 | (EP) . |
| 0615193 | 9/1994 | (EP) . |
| 2251323 | 7/1992 | (GB) . |
| 58-215794 | 12/1983 | (JP) . |
| 58-215795 | 12/1983 | (JP) . |
| 59-162695 | 9/1984 | (JP) . |
| 60-179857 | 5/1986 | (JP) . |
| 59-45695 | 3/1987 | (JP) . |
| 62-283496 | 12/1987 | (JP) . |
| 62-283497 * | 12/1987 | (JP) . |
| 63-183700 | 7/1988 | (JP) . |
| 1235075 | 9/1989 | (JP) . |
| 2189790 | 7/1990 | (JP) . |
| 3025798 | 2/1991 | (JP) . |
| 3030034 | 2/1991 | (JP) . |
| 3283094 | 12/1991 | (JP) . |
| 4123243 | 4/1992 | (JP) . |
| 4243096 | 8/1992 | (JP) . |
| 5289039 | 2/1993 | (JP) . |
| 5204561 | 8/1993 | (JP) . |
| WO92/18928 | 10/1992 | (WO) . |
| WO93/11491 | 6/1993 | (WO) . |
| WO94/27382 | 11/1994 | (WO) . |

OTHER PUBLICATIONS

Leibson, "Nonvolatile, In–Circuit–Reprogrammable Memories," EDN Special Report, Jan. 3, 1991, pp. 89–97, 100 & 102.

Nozaki et al., "A 1–Mb EEPROM with MONOS Memory Cell for Semiconductor Disk Application," *IEEE Journal of Solid State Circuits*, vol. 26, No. 4, Apr. 1991, pp. 497–501.

Auclair, "Optimal Solid State Disk Architecture for Portable Computers," SunDisk, presented at the Silicon Valley PC Design Conference, Jul. 9, 1991, pp. 1–4.

Hwang, K.; Briggs, F.A., *Computer Architecture and Parallel Procssing*, McGraw–Hill, 1984, p. 64.

* cited by examiner

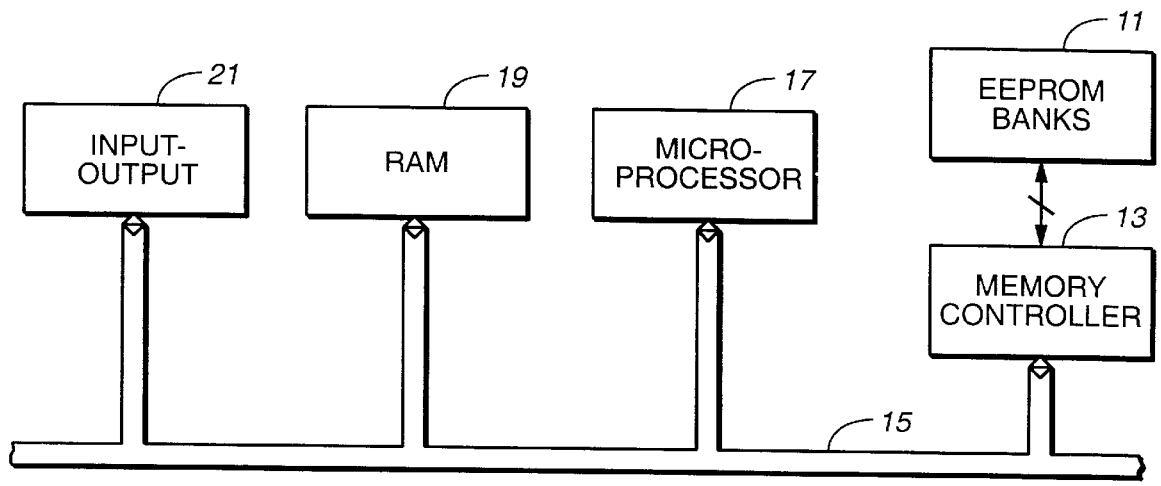
FIG._1
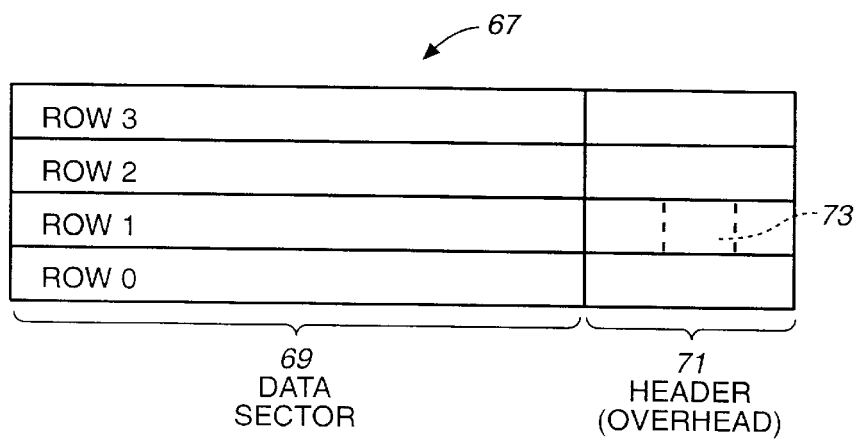
FIG._4

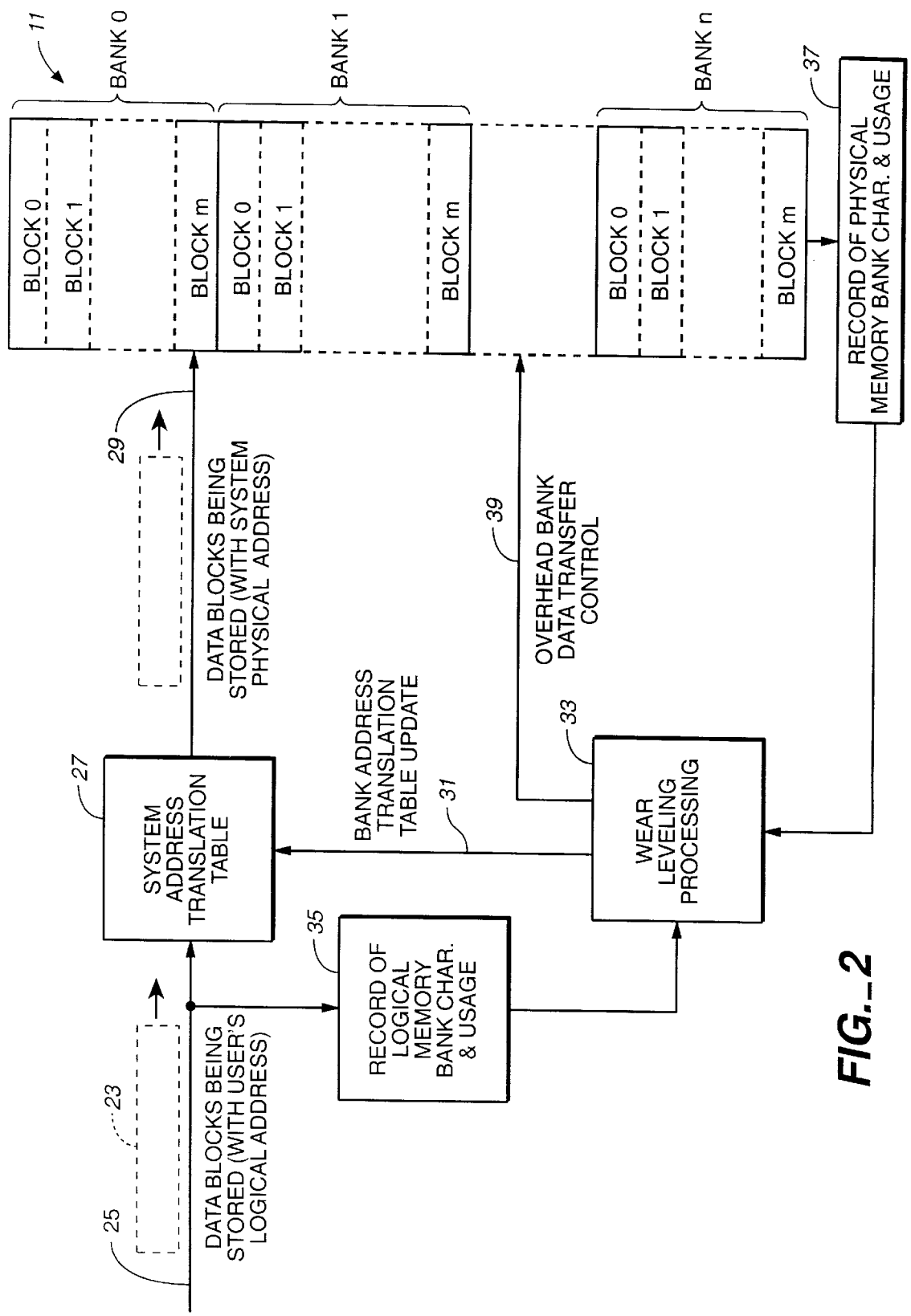
FIG._2

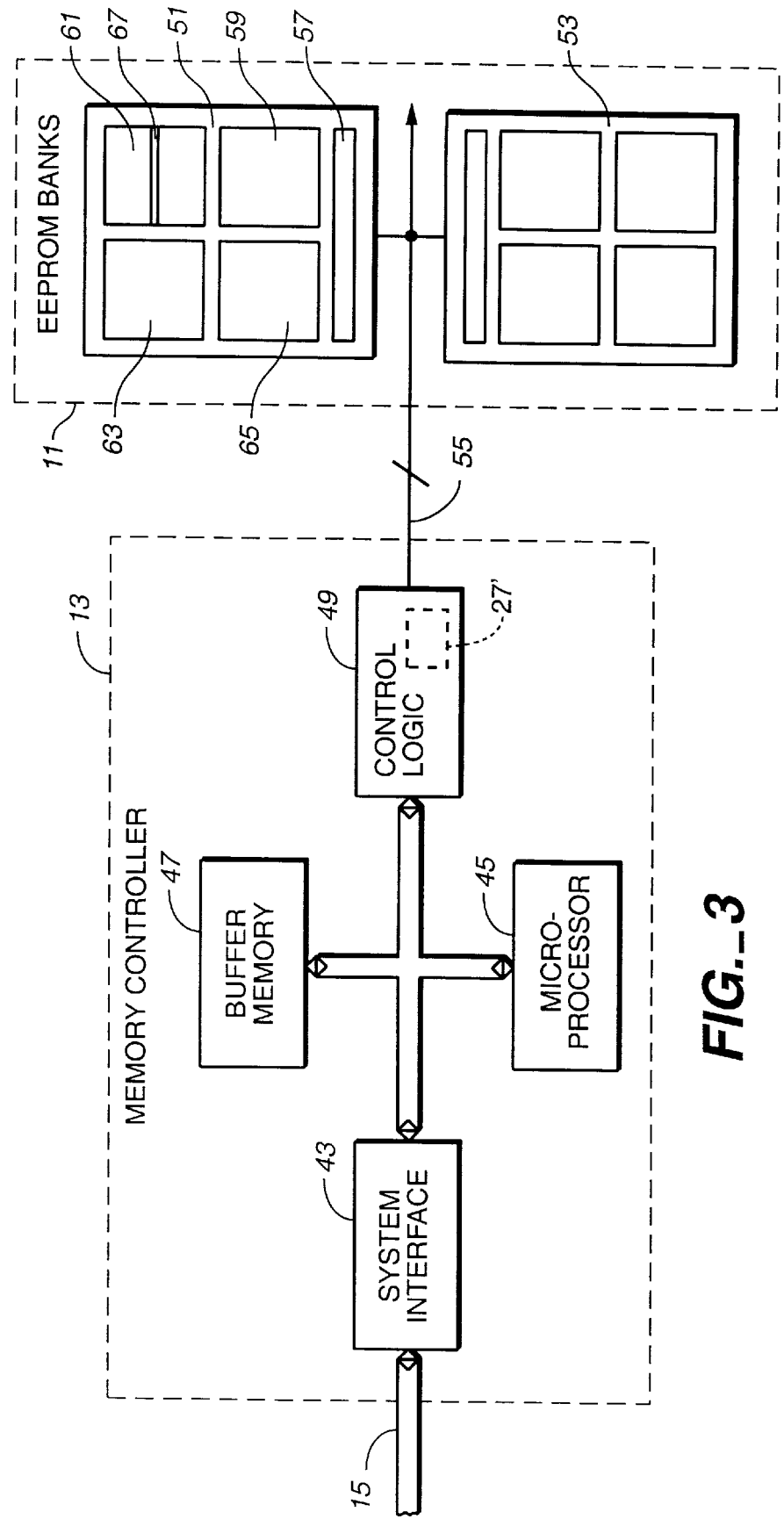
FIG._3

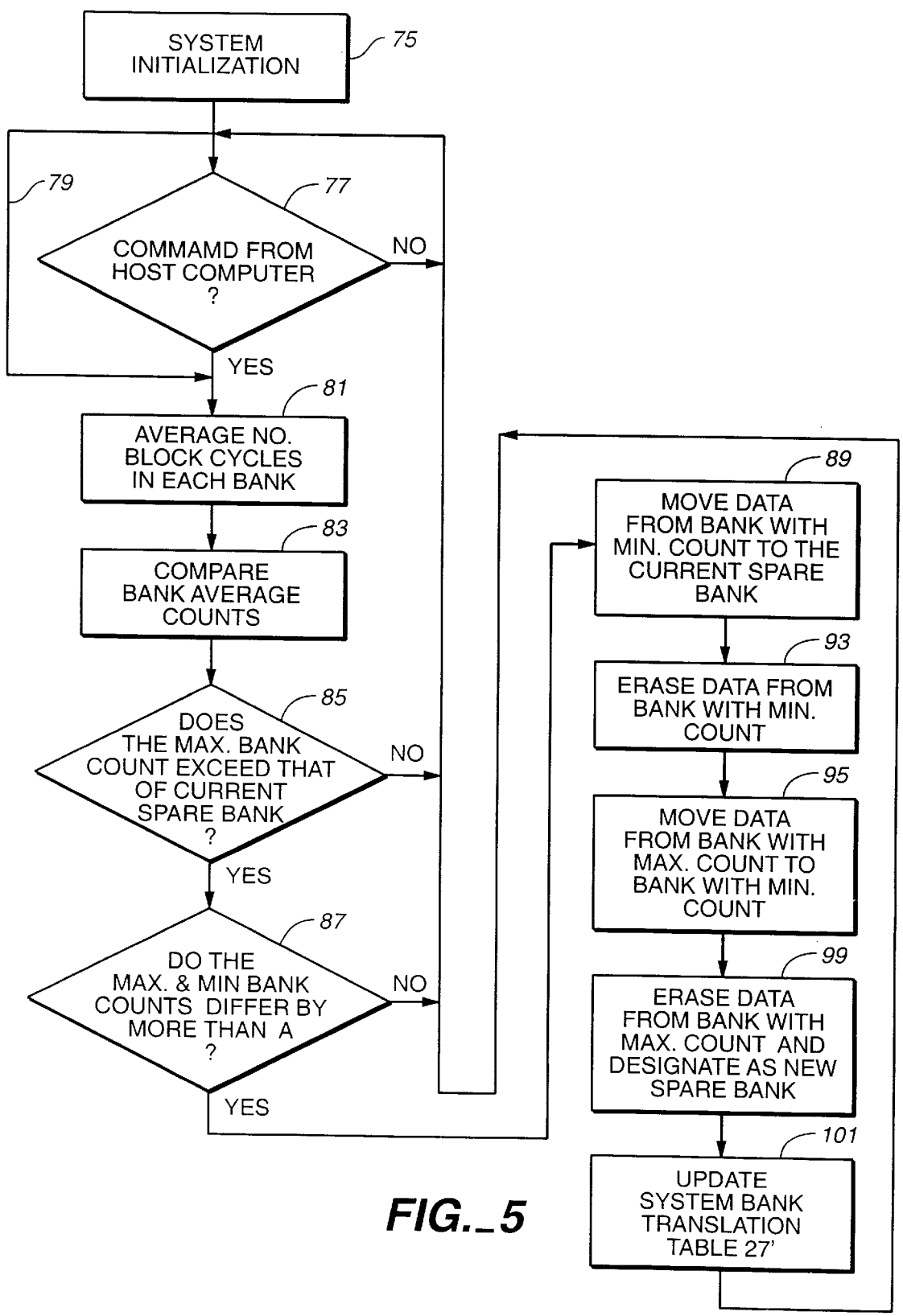
FIG._5

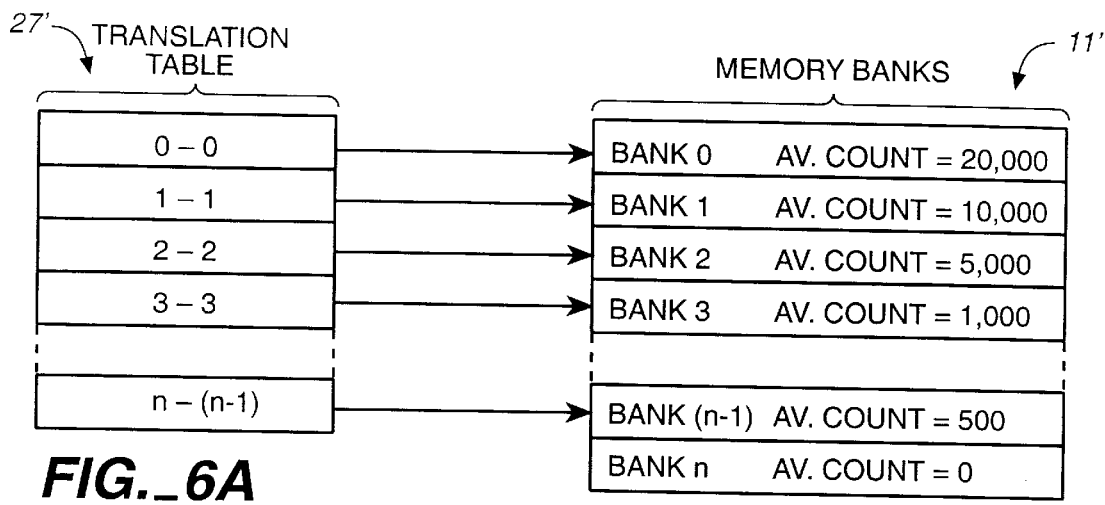
FIG._6A
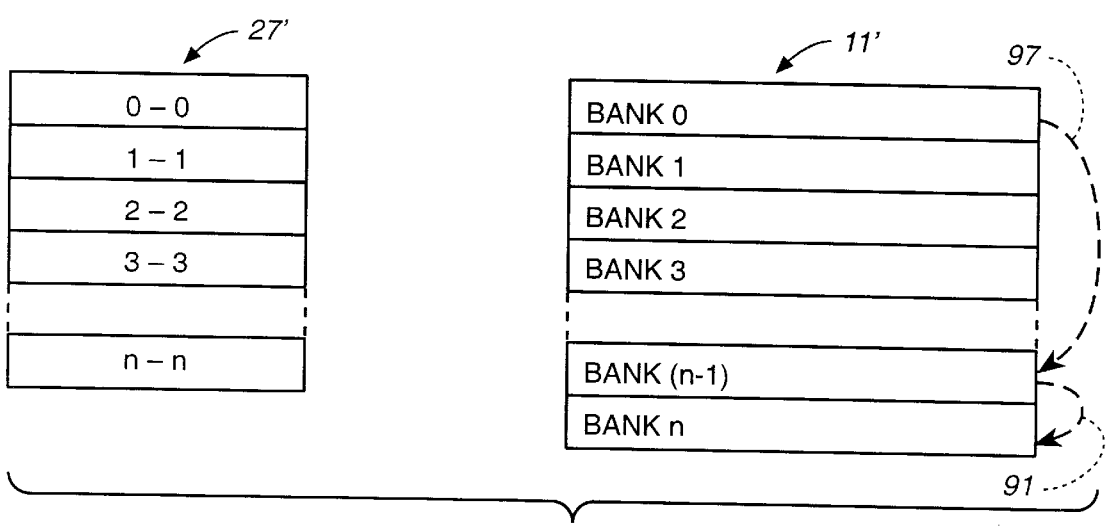
FIG._6B
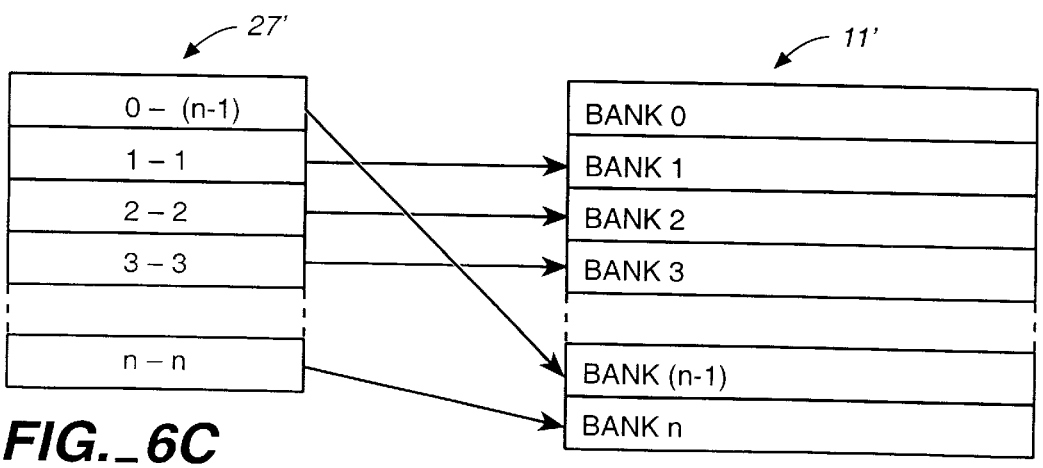
FIG._6C

WEAR LEVELING TECHNIQUES FOR FLASH EEPROM SYSTEMS

BACKGROUND OF THE INVENTION

This invention relates generally to mass digital data storage systems using flash electrically erasable and programmable read only memory ("EEPROM") technology, and, more specifically, to techniques of controlling the use of such systems in order to improve their useful life.

An advantage of using EEPROM technology is that a solid-state, non-volatile memory is provided, which can be repetitively reprogrammed. Each EEPROM cell includes an electrically floating gate positioned over a substrate channel between source and drain regions. A thin gate oxide layer separates the floating gate from the substrate. The threshold level of the cell is controlled by an amount of charge that is placed on the floating gate. If the charge level is above some threshold, the cell is read to have one state, and if below that threshold, is read to have another state.

The desired floating gate charge level is programmed by applying an appropriate combination of voltages to the source, drain, substrate and a separate control gate, for a designated period of time, in order to cause electrons to move from the substrate to the floating gate through the gate oxide layer. Current leakage from the floating gate is very small over time, thereby providing permanent storage. The charge level on the floating gate can be reduced by an appropriate combination of voltages applied to the elements described above, but it is preferable to include a separate erase gate that is positioned adjacent the floating gate with a thin layer of tunnel oxide between them.

A large number of such cells form a memory. The cells are preferably arranged on a semiconductor integrated circuit chip in a two-dimensional array with a common control gate provided for a row of such cells as a word line and the cells in each column having either their drain or source connected to a common bit line. Each cell is then individually addressable by applying the appropriate voltages to the word and bit lines that intersect at the desired cell. Rather than providing for such individual addressing for the purpose of erasing the cells, however, the erase gates of a block of cells are generally connected together in order to allow all of the cells in the block to be erased at the same time, i.e., in a "flash".

In operating such a memory system, cells can be rewritten with data by either programming with electrons from the substrate or erasing through their erase gates, depending upon the state in which they are found and the state to which they are to be rewritten. However, flash EEPROM systems are generally operated by first erasing all of the cells in a erasable block to a common level, and then reprogramming them to desired new states.

Flash EEPROM mass storage systems have many advantages for a large number of applications. These advantages include their non-volatility, speed, ease of erasure and reprogramming, small physical size and similar factors. Because there are no mechanical moving parts, such systems are not subject to failures of the type most often encountered with hard and floppy disk mass storage systems. However, EEPROM cells do have a limited lifetime in terms of the number of times they can be reprogrammed or erased. As the number of cycles to which a cell is subjected reaches a few tens of thousands, it begins to take more voltage and/or time to both program and erase the cell. This is believed due to electrons being trapped in the respective gate and tunnel dielectric layers during repetitive programming and erase cycles. After a certain number of cycles, the number of electrons that are so trapped begin to change the operating characteristics of the cell. At some point, after one hundred thousand or more such cycles, so much voltage or time is required to either program or erase the cell, or both, that it becomes impractical to use it any further. The lifetime of the cell has at that point ended. This characteristic of EEPROM cells is described in European Patent Application Publication No. 349,775—Harari (1990).

Therefore, it is a principal object of the present invention, given a finite lifetime of individual EEPROM cells, to maximize the service lifetime of an entire mass storage EEPROM system.

SUMMARY OF THE INVENTION

This and additional objects are accomplished by the present invention, wherein, briefly and generally, the EEPROM array of cells is divided into two or more interchangeable banks of cells, each bank having one or more blocks of cells. A block is the smallest group of cells that is erasable or programmable at one time. A memory controller provides for interchanging such banks over the lifetime of the memory at times when it is detected that they are receiving significantly uneven use.

If such an interchange, or wear leveling, is not carried out in the case where there is significantly uneven use among groups of EEPROM cells, one group will reach its end of lifetime while other groups have significant life left in them. When one group reaches an end of lifetime, the entire memory may have to be replaced unless extra groups of memory cells are included in the system for replacing those that reach their lifetime. However, the techniques of the present invention allow for extending overall memory system lifetime without having to provide such replacement groups of memory cells. The ability to interchange groups of cells to result in more even wear among the groups is particularly advantageous in computer system applications wherein flash EEPROM memory is used in the nature of a disk drive. This is because the memory is subjected to frequent erase and reprogramming cycles in some groups but not others, and since the large capacity of the memory would require a large number of spare groups in order to obtain a reasonable memory system lifetime without use of the group interchange technique of the present invention.

Additional objects, advantages and features of the various aspects of the present invention will become apparent from the following description of its preferred embodiments, which description should be taken in conjunction with the accompanying drawings.

BRIEF DESCRIPTION OF THE DRAWINGS

FIG. 1 generally illustrates in block diagram form a computer system with non-volatile solid state memory that utilizes the various aspects of the present invention;

FIG. 2 schematically illustrates ways in which the solid state memory in the system of FIG. 1 may be operated in accordance with the present invention;

FIG. 3 shows in block diagram form a specific type of memory system of FIG. 1 in which the present invention is utilized;

FIG. 4 shows a preferred organization of a block of memory cells of the system of FIG. 3;

FIG. 5 is a flow diagram showing a preferred operation of the memory system of FIGS. 3 and 4; and FIGS. 6A, 6B and 6C illustrate certain operations set forth in the flow diagram of FIG. 5.

DESCRIPTION OF THE PREFERRED EMBODIMENTS

In order to set forth one environment in which the improved memory system of the present invention may be utilized, FIG. 1 shows a general computer system that includes flash EEPROM memory array 11 whose operation is controlled by a memory controller 13. The memory system 11 and 13 is connected to a computer system bus 15, to which also are connected a system controlling microprocessor 17, random access memory ("RAM") 19, input/output circuits ("I/O") 21, and various other components as appropriate for a specific computer system. In the improvements being described, the memory controller 13 manages operation of the EEPROM memory 11 in a way to maximize the lifetime of the memory system by avoiding uneven use of any one part of it.

FIG. 2 is a diagram which conceptually and generally illustrates such a memory operation technique as well as showing various alternatives for specific implementations of the technique. The EEPROM memory 11 is organized into a large number of blocks of flash EEPROM cells, each block being the smallest unit of cells that is flash erasable. In the case where separate erase gates are provided as part of the EEPROM cells, all the erase gates of the cells in each block are connected together. The blocks of memory cells are further organized into banks. Each of the n banks in this illustration contain m blocks. The quantity n must be at least two, and the quantity m is one or more.

In a specific form, each block is designed to contain a standard computer sector's worth of data plus some overhead fields. Blocks of data, indicated in dashed outline by a block 23, are received from the computer system over the bus 15, indicated to travel along a path 25. A logical address of a memory location for a block 23 to be written into is also sent by the computer system. This logical address is converted by an address translation table 27 into a physical memory address. A path 29 indicates the block within the memory 11 into which the data is to be written. The address translation table 27 simply converts a given logical address from the computer system into a corresponding physical address of a block within the memory 11 that is to receive that data. As explained later, the translation table 27 is reprogrammable by signals in a path 31 from a processing unit 33 to redirect data blocks of given logical addresses into different physical banks of the memory 11 in order to even out use of the banks.

In preparation for the processing circuits 33 to decide whether such redirection is required, information is first gathered of memory characteristics and usage. A running record 35 tabulates information from logical addresses of data blocks being directed to the memory system from the computer system. Another running record 37 tabulates information of physical block usage within the memory array 11 itself. The processing circuits 33 take this data from either or both of the records 35 and 37 and determine whether any data shifting among banks in the memory is required. Depending upon specific applications, some of the information available from monitoring the logical or physical addresses of data blocks being programmed is used, and sometimes both. The purpose of the conceptual diagram of FIG. 2 is to explain a wide range of options for specific implementations of wear leveling. In this example, it is assumed that the banks are the smallest units of memory which may be swapped in response to utilization of this information.

Among the types of information that may beneficially be acquired by the records 35 and 37 are the following:

(a) The total number of blocks of memory with which the computer system is working at the moment. The number of logical blocks recognized by the host computer operating system, noted in the record 35, will obviously be no more than the number of available physical blocks within interchangeable banks, noted in the record 37, and will likely be fewer. The physical specification obviously can be no higher than the number of physical blocks of memory available for data storage, and generally will be less in order to allow for some memory blocks becoming defective.

(b) For each of the available blocks, a record may be maintained of the number of times that the block was written since operation of the memory array 11 was first started. This number for physical blocks maintained by the record 37 will be higher than the logical number in record 35 because of overhead writes which the memory controller 13 may cause to occur.

(c) A total number of block writing cycles that have been initiated since the memory array 11 was first put into operation, the logical number in record 35 and the physical number in record 37.

(d) The total number of cycles experienced by the interchangeable banks, either by way of a total of all the blocks of each bank, or by way of an average number per bank. Both a logical record 35 and a physical record 37 of this may be maintained.

(e) Related to (d) is to maintain an identification of the banks having the minimum and the maximum number of cycles. The minimum and maximum numbers can than be quickly ascertained.

This provides a great deal of information from which the processing 33 can determine whether there is uneven wear among the various banks of memory cells. The records 35 or 37 may be stored in separate tables or, to the extent possible, maintained as part of the blocks to which the data pertains in an overhead section or the information stored in the block. Where an accumulation of numbers must be made, it is preferable to keep running totals in order to minimize the amount of processing that is necessary when the wear leveling operation is performed. The processing 33 can use this information in a number of different ways to detect when one or more of the memory banks is being used considerably more frequently than one or more of the other memory banks.

As an example of one alternative, the maximum usage of any of the banks is first noted and a calculation made of the total number of block writes which could have been accomplished if each bank of the memory 11 was used to the exactly the same amount. This is the ideal, perfect even wear of the memory that is a goal of the wear leveling process. This is then compared with the total number of erase and write cycles that have occurred in the memory, the arithmetical difference being indicative of how far the system is operating from that ideal. A high difference value indicates a large imbalance in usage among the blocks. It may be calculated either from data acquired from the logical address records 35 or from the physical address records 37. In order to save memory, the logical address records 35 may be omitted entirely if the system speed is not unduly limited by the omission.

A wear leveling operation can be triggered by that difference exceeding a certain magnitude. Alternatively, that difference can be used in conjunction with other data before a wear leveling event is initiated. That other data includes static information of the ideal number of blocks that could be written during the life of the memory system if the wear is perfectly evenly distributed. A target for a total actual number of blocks to be stored over the lifetime of the memory is then determined, taking into account that perfectly even wear is not going to occur under any circumstances. This static difference between the ideal and target number of total block writes during the lifetime of the system is then compared with the actual difference number described above. When that calculated difference is about the same or less than the static target difference, the memory is operating within its target parameters and no action is taken. However, when the calculated difference number exceeds the static target difference, the memory is not operating up to expectations. If continued to operate in that manner, one or more blocks of the memory will reach their end of lifetime before the targeted number of user writes has been reached. Therefore, when the calculated difference exceeds the target difference by some amount, the wear leveling process 33 is then initiated.

When wear leveling is accomplished, two main events occur. First, as indicated by a path 39 of FIG. 2, data is transferred between the most heavily used and least used banks. For example, if bank 0 has a very large number of erase and rewrite cycles when compared to that of bank 1, that data in each of these banks can be swapped. The second thing that happens is that the address translation table is updated to result in directing data blocks formerly directed to bank 0 to bank 1, and vice versa. Logical addresses from the computer system that previously caused its associated data block to be written into a block having a physical address within bank 0 will now cause the block to be written within bank 1. Similarly, data blocks previously directed to bank 1 are directed to bank 0.

As can be visualized from FIG. 2, the wear leveling processing is accomplished in a feedback system. Adjustments are made in the memory bank assignments in order to minimize a selected one of the above described differences. Those differences are calculated from data which results from those memory bank assignments. The differences can be viewed as feedback control variables. Adjustments in operation of the memory are made to minimize the selected feedback variable.

Some limitation should be imposed on how often the wear leveling process is allowed to take place. If done again before there have been many operational cycles experienced by the memory, the process will undesirably swap operation of the system back to the previous condition of promoting maximum uneven wear. If the process is allowed to be immediately performed a further time, operation will swap back to the low wear level case, and so on. Unnecessary use of the wear leveling process simply adds to wear of the memory, and shortening its life, rather than extending it. Therefore, some limitation is preferably imposed on how often the wear leveling process is performed, such as by allowing it only after many thousands of cycles have occurred since the last time. This is, in effect, a limitation upon the feedback system loop gain.

Another example of a way of determining when wear leveling is necessary is to compare the number of block writes which have occurred to the present time in each of the memory banks, either by total number of block writes or some type of average of cycles of blocks within the bank, by monitoring the physical memory usage record 37. When those bank usage numbers are significantly different from each other, uneven wear among the banks is apparent. When these numbers become skewed in excess of a set threshold amount, then the wear leveling processing 33 is initiated.

It is this latter technique that is used in a specific implementation which will be described with respect to FIGS. 3–6. FIG. 3 provides an outline of a specific system in which this wear leveling technique is employed. The memory controller 13 includes appropriate circuits 43 for interfacing with the computer system bus 15, a controller microprocessor 45, volatile buffer memory 47 for temporarily storing data being written to or read from the memory, and control logic circuitry 49. These circuit units are interconnected and under the control of the microprocessor 45. The control logic circuitry 49 includes the memory system address translation table 27', corresponding to the table 27 described with respect to FIG. 2. The EEPROM banks 11 are formed of a number of individual integrated circuit chips, such as circuit chips 51 and 53, which are connected to the controller logic 49 over circuits 55. The number of EEPROM circuit chips employed depends upon storage capacity desired for the memory system. Further details of the system illustrated in FIG. 3 can be had by reference to a co-pending patent application entitled "Device and Method for Controlling Solid-State Memory System", Ser. No. 07/736,733, filed Jul. 26, 1991, naming Robert D. Norman, Karl M. J. Lofgren, Jeffrey Donald Stai, Anil Gupta, and Sanjay Mehrotra as inventors.

The EEPROM cells are arranged on each of the integrated circuit chips 51, 53, etc., in four separate two-dimensional arrays of rows and columns of such cells. Referring to the circuit chip 51, for example, a small area 57 contains interfacing circuits, while four areas 59, 61, 63 and 65 provide separate arrays of rows and columns of memory cells arranged as quadrants of the chip. In this specific example, each of the quadrants 59, 61, 53 and 65 is designated as a memory bank, the smallest unit of memory that is swapped in order to improve wear leveling. A large number of such banks are provided in a typical memory system that can employ from a few to many EEPROM integrated circuit chips, with four such banks per chip. Each bank is, in turn, subdivided into memory blocks, such as the block 67 illustrated in the bank 61. Each bank can contain from several to hundreds of such blocks, depending, of course, on the density of the EEPROM cell formations on the chip, its size, and similar factors. Alternatively, but usually not preferred, each bank can have a single block.

The nature of each block is illustrated in FIG. 4. Each block contains, in this example, four rows of memory cells. Most of the cells in each row form a portion 69 devoted to storing a sector of data. Such a data sector will typically conform to existing computer standards, such as having a capacity of 512 bytes. Accompanying each such data sector is header information, which is stored in another portion of each of the four rows of the block. Each such block is the smallest unit of the memory system which can be separately erased. That is, all of the erase gates of each memory block are connected together for simultaneous erasure when appropriately addressed. Although multiple blocks may be erased at one time, portions of memory smaller than a block size are not separately erasable.

A field 73 is included in the header 71 to maintain a count of the number of times that the block has been erased and rewritten. As part of an erasure and rewrite cycle, this count is updated by one. When data is swapped among memory banks in order to accomplish wear leveling, it is the data stored in the portion 69 of each block of a bank that is swapped. The header 71, including the cycle count field 73, remains with its physical block. The cycle count 73 starts with one the first time its respective block of a new memory is erased and written, and is incremented by one upon the occurrence of each subsequent cycle during the lifetime of the memory. It is the count field 73 of each block that is read and processed periodically throughout the lifetime of the memory in order to determine whether there is uneven wear among the various memory banks and, if so, how a leveling of that uneven use can be accomplished.

A process flow diagram of FIG. 5 provides an example of wear leveling control of the memory system described above with respect to FIGS. 3 and 4. In this example, the process can be begun either automatically upon each initialization of the computer system, as indicated by a step 75, or upon the memory controller 13 receiving a command from the host computer system microprocessor 17, as indicated by a step 77. Whether the process is begun automatically upon system initialization at step 75 depends upon how the memory controller is set by a hard wire connection. A process path 79 indicates the controller being set to commence a review of the wear leveling each time the system is initialized, such as each time power is turned on to the system. In either event, the process is controllable by the host computer system, generally as part of an operating software system that periodically causes the wear leveling review to begin.

Once begun, as indicated by a step 81, the cycle count field 73 of each data storage block in the system is read. An average block cycle count for each bank is then calculated from these numbers. The average cycle counts for each bank, as indicated by a step 83, are then compared to determine whether there is such an imbalance of use of the various banks that a wear leveling operation should take place.

Even though the steps 75 and 77 provide a limitation and control on how often this process is accomplished, a step 85 shows a further limitation, which references the average bank usage count numbers. As will be explained more fully below, the system includes a spare bank of memory which is used in the wear leveling process. During each implementation of the process, the bank having the highest average block usage count is designated as the current spare bank. Thus, in order to prevent banks from being unnecessarily swapped back and forth, the count of the current spare bank, which has not been used for data storage purposes since the last wear leveling operation, provides a benchmark. Only if the usage of some other bank exceeds the previous record use carried by the current spare bank, then the process continues.

A next step 87, in that case, compares the maximum and minimum bank usage numbers to determine whether they differ by more than some present number A. If not, the wear leveling process reverts back to the step 77 wherein it awaits another command from the host computer system. If the difference does exceed A, however, then a swapping of banks of memory is accomplished in subsequent steps in order to even out the bank usage during future cycles. An example of the difference number A is 15;000 erase and write cycles. That number can vary considerably, however, depending upon the desired memory system operation. If the number is made too small, wear leveling cycles will occur too frequently, thus adding to the wear of the system since some overhead erase and rewrite cycles are required each time the wear leveling process in accomplished. If the number A is too large, on the other hand, the lifetime of the memory system is likely to be cut short by one or more banks reaching its lifetime limit of erase and rewrite cycles long prior to other banks approaching such a limit.

Before proceeding with other steps of the process of FIG. 5, an example of the translation table 27' and its use is indicated in FIG. 6A. This state of the translation table 27' assumes a simplistic correspondence between logical and physical memory addresses. Data blocks having logical addresses within bank 0 are mapped by the translation table 27' into physical bank 0, those of logical bank 1 to physical bank 1, and so forth.

As a first step 89 of a leveling procedure, data stored in the bank with the minimum count is written into the current spare memory bank. This is illustrated in FIG. 6B. Assuming the average block counts for each of the banks are set forth for purposes of explanation in FIG. 6A, bank 0 at this point in time has the highest average count, and bank (n-1) has the lowest. Bank n is the current spare bank. Therefore, in step 89 of FIG. 5, data is moved from bank (n-1) to bank n, as indicated at 91. Next, as indicated by a step 93 of FIG. 5, the minimum count bank (n-1) is erased. In a next step 93, the data of the maximum bank 0 is written into the former minimum usage bank (n-1), as indicated at 97 of FIG. 6B. A next step 99 then erases the maximum used bank 0 and it is designated as a new spare bank.

Finally, as indicated by a step 101, the translation table 27' is updated so that blocks of data within the swapped banks are redirected to those new physical bank locations. FIG. 6C shows an example of that, where the translation table 27' is changed from what it was in FIG. 6A to level out the wear of the various banks during future erase and rewrite cycles. accordingly, the most heavily used bank having a logical address 0 is remapped into the bank (n-1), the same bank into which the physical bank 0 data blocks were written earlier in the process. Similarly, the least used logical bank n address is remapped into physical bank n, the previous spare bank in the state shown in FIG. 6A. The most heavily used bank 0, as shown in FIG. 6C, has no logical banks mapped into it. Bank 0 is now the new current spare bank. It has the maximum use of any bank to-date. It will now rest and the wear leveling process will not be accomplished again until the usage of some other bank exceeds that of bank 0, as determined in step 85 of FIG. 5.

Alternatively, a spare bank of EEPROM memory need not be designated for the wear leveling process, thus freeing up another bank for storing data. Data can simply be swapped between the banks experiencing the maximum and minimum cycles to-date, and the translation table 27' then being updated to redirect data accordingly. The controller buffer memory 47 can be used for temporary storage of data from the maximum and minimum use banks as data is being swapped between them. The count of the most heavily used bank is then remembered and used in the comparison step 35 when determining whether the imbalance is sufficient to justify the wear leveling process being performed. However, since the buffer memory 47 is usually preferred to be RAM, any power failure or significant power glitches occurring during the wear leveling process will cause data to be lost. The use of the spare bank in the manner described above will prevent such a data loss since the data of each block being swapped will remain in EEPROM memory at all times.

Although the various aspects of the present invention have been described to its preferred embodiments, it will be understood that the invention is entitled to protection within the full scope of the appended claims.

It is claimed:

1. A method of managing operation of an EEPROM mass storage system divided into a number of groups of memory cells which are periodically rewritten with new data, wherein individual groups of memory cells have an endurance limit of a maximum number of rewrite cycles to which they can be subjected, comprising:

monitoring a number of rewrite cycles directed at individual groups of memory cells and identifying a first of the individual groups of memory cells that has experienced a highest number of rewrite cycles, determining, before any of the individual groups of memory cells reaches its endurance limit, when a predetermined imbalance exists between the number of rewrite cycles experienced by said first of the individual groups of memory cells and a number of rewrite cycles experienced by others of said individual groups of memory cells than said first of the groups of memory cells, and in response to such an imbalance determination, redirecting further rewrite cycles from said first of the individual groups of memory cells to one or more of others of the individual groups of memory cells, thereby tending to reduce the imbalance during further rewrite cycles.

2. The method according to claim 1 wherein monitoring the number of rewrite cycles includes accumulating a number of rewrite cycles of individual groups of memory cells by monitoring logical group addresses applied to the storage system before any conversion to physical group addresses.

3. The method according to claim 1 wherein monitoring the number of rewrite cycles includes accumulating a number of rewrite cycles of individual groups of memory cells by monitoring physical group addresses that are translated from logical group addresses applied to the storage system.

4. The method according to claim 1 wherein determining the imbalance includes:

identifying a second of said individual groups of memory cells having a lower number of rewrite cycles than others of said individual groups of memory cells, and determining whether a difference between the number of rewrite cycles of said first and second of said individual groups of memory cells exceeds a predetermined threshold.

5. The method according to claim 1 which additionally comprises swapping stored data among said first and another of the individual groups of memory cells.

6. The method according to claim 5, wherein swapping stored data includes use of a third individual group of memory cells to which data is transferred from either said first or said another individual group of memory cells.

7. The method of claim 1 which additionally comprises continuing to designate data for rewriting to both of said first of the individual groups of memory cells and said one or more others of the individual groups of memory cells.

8. The method according to claim 1 of managing operation of an EEPROM mass storage system that further is adapted to receive externally supplied addresses of individual blocks of memory cells within said individual groups of memory cells, and wherein redirecting further rewrite cycles includes redirecting the externally supplied addresses to specific ones of the individual groups of memory cells during said further rewrite cycles.

9. The method according to claim 8 wherein redirecting the externally supplied addresses includes accessing a table that contains a translation between the externally supplied addresses and unique ones of the individual groups of memory cells.

10. The method according to any one of claim 1, 8 or 9, wherein the memory cells within the individual groups of memory cells are simultaneously erasable.

11. The method according to any one of claim 1, 8 or 9 wherein the individual groups of memory cells include a plurality of blocks of memory cells wherein the memory cells within the individual blocks of memory cells are simultaneously erasable, and wherein monitoring the number of rewrite includes:

monitoring a number of rewrite cycles directed at individual blocks of memory cells, and determining the number of rewrite cycles experienced by the individual groups of memory cells by arithmetically combining the number of rewrite cycles directed at the individual blocks of memory cells within the individual groups of memory cells.

12. A method of managing operation of an EEPROM mass storage system divided into a number of groups of memory cells which are periodically rewritten with new data, wherein individual groups of memory cells have an endurance limit of a maximum number of rewrite cycles to which they can be subjected, comprising:

monitoring a number of rewrite cycles directed at individual groups of memory cells, determining, before any of the individual groups of memory cells reaches its endurance limit, when a predetermined imbalance exists in a number of rewrite cycles directed at said individual groups of memory cells, wherein determining the imbalance includes:

identifying one of said individual groups of memory cells having a highest number of rewrite cycles, calculating a total number of group rewrite cycles that the EEPROM mass storage system could accommodate if all of said individual groups of memory cells had the same number of rewrite cycles as said one individual group of memory cells, and determining whether a difference between that calculated total number and a total number of rewrite cycles actually directed to all of said individual groups of memory cells exceeds a predetermined threshold, and in response to such an imbalance determination, reassigning at least one of the individual groups of memory cells to receive data designated for at least another of the individual groups of memory cells in order to correct the imbalance during further rewrite cycles.

13. A non-volatile memory system, comprising:

an array of EEPROM cells arranged in a plurality of banks which each include a number of separately addressable and erasable blocks, means responsive to receipt of sectors of data and unique logical addresses of the sectors for translating between said logical addresses and physical addresses of said blocks in which the sectors of data are stored, means monitoring the blocks to which data is being written for maintaining a count of an average number of erase and rewrite cycles that the blocks within individual ones of the banks have experienced including one of the plurality of banks having a highest average number of erase and rewrite cycles, means responsive to said count maintaining means for determining when a difference between a maximum and minimum average number of erase and rewrite cycles of the individual ones of the banks exceeds a given threshold, means responsive to said given threshold being exceeded for transferring data from blocks of a first bank having the minimum number of erase and rewrite cycles into a spare bank of blocks, means responsive to said given threshold being exceeded for transferring data from blocks of a second bank having the maximum number of erase and rewrite cycles into blocks of the first bank, said second bank then becoming a spare bank, and means responsive to said given threshold being exceeded prior to the average number of erase and rewrite cycles of blocks within individual ones of the banks reaching an endurance limit of the EEPROM cells for altering said translating means to redirect future data logically addressed to said first bank to said spare bank and to redirect data logically addressed to said second bank to said first bank, thereby to even the wear on the memory banks and extend the life of the flash memory.

14. The memory system of claim 13 wherein said count maintaining means includes means for averaging a number of erase and rewrite cycles of the blocks within the banks and using that average as the number of erase and rewrite cycles said banks have experienced.

15. The memory system of claim 13 which additionally comprises means for disabling operation of said data transferring means and said translating means altering means unless the number of erase and rewrite cycles experienced by the second bank exceeds a number of erase and rewrite cycles experienced by a spare bank.

16. A non-volatile memory system of a type having an array of EEPROM cells arranged in a plurality of separately addressable and erasable blocks of cells, comprising:

means responsive to receipt of sectors of data and unique logical addresses of the sectors for translating between said logical addresses and physical addresses of certain ones of said blocks of cells in which the sectors of data are stored, means monitoring either the logical addresses or the physical addresses of sectors of data being received for maintaining a cumulative count of a number of erase and rewrite cycles to which said blocks of cells have been individually subjected, means responsive to said count maintaining means for determining when a predetermined imbalance is reached among the maintained counts of the number of erase and rewrite cycles of individual blocks of cells, wherein the imbalance determining means includes:

means responsive to said cumulative count maintaining means for identifying a bank of said blocks having a highest number of erase and rewrite cycles, means responsive to said identifying means for determining a total number of erase and rewrite cycles that the array of EEPROM cells could accommodate if all of a plurality of banks of blocks had the same number of erase and rewrite cycles as said identified bank of blocks, and means responsive to said total number determining means and to said count maintaining means for comparing said total number with a number of erase and rewrite cycles to which all of said plurality of banks is actually subjected, and means responsive to said predetermined imbalance being reached and before any of the individual blocks of cells reaches an endurance limit for transferring existing sectors of data and redirecting future data sector writes among the blocks of cells in a manner to more evenly distribute erase and rewrite cycles among the blocks of cells, whereby the life of the array of EEPROM cells is extended.

17. A method of operating a mass storage system of a plurality of groups of EEPROM cells that have a lifetime of a maximum number of erase and rewrite cycles, comprising:

repeatedly erasing individual ones of said plurality of groups of cells and rewriting data into cells within the erased groups of cells by mapping externally supplied data addresses into addresses within the erased groups of cells, maintaining a cumulative count of a number of erase and rewrite cycles experienced by individual ones of said plurality of groups of cells, calculating a quantity indicative of an extent of variation among the counts experienced by the plurality of groups of cells within the system including one of the groups of cells having a highest number of experience counts, comparing the calculated quantity with a preset threshold value, in response to said calculated quantity exceeding said preset threshold value and prior to an individual group attaining a maximum experience count equal to said lifetime, remapping the externally supplied data addresses in a manner to write data formerly directed to groups of cells with the highest number of counts to groups of cells with lower counts, thereby tending to reduce the extent of variation among the counts during future erase and rewrite cycles, and thereafter, erasing and rewriting data into individual ones of said plurality of groups of cells in accordance with such remapping.

18. The method according to claim 17 additionally comprising calculating a total number of counts of groups of cells that the memory could accommodate if all of said groups of cells had the same count as said one group of cells, and wherein comparing the calculated quantity includes comparing the calculated total number of counts of the groups of cells with said preset threshold value.

19. The method according to claim 17 wherein calculating the experience count variation includes identifying a first of said groups of cells having a higher count than others of said groups of cells, and identifying a second of said groups of cells having a lower count than others of said groups of cells, and wherein comparing the calculated quantity includes comparing a difference between the number of rewrite cycles of said first and second groups of cells with said preset threshold value.

20. The method according to claim 17 which additionally comprises, prior to remapping the externally supplied addresses, of moving data between those groups of cells being remapped in accordance with the remapping.

21. A method of operating a mass storage system of a plurality of groups of EEPROM cells that have a lifetime of a maximum number of erase and rewrite cycles, comprising:

repeatedly erasing individual ones of said plurality of groups of cells and rewriting data into cells within the erased groups of cells by mapping externally supplied data addresses into addresses within the erased groups of cells, maintaining a cumulative count of a number of erase and rewrite cycles experienced by individual ones of said plurality of groups of cells, calculating a quantity indicative of an extent of variation among the counts experienced by the plurality of groups of cells, comparing the calculated quantity with a preset threshold value, in response to said calculated quantity exceeding said preset threshold value and prior to an individual group attaining a maximum experience count equal to said lifetime, remapping the externally supplied data addresses in a manner to write data formerly directed to groups of cells with high counts to groups of cells with lower counts, thereby tending to reduce the extent of variation among the counts during future erase and rewrite cycles, wherein, remapping the externally supplied addresses includes swapping addresses of those groups of cells having a lowest and a highest count, and thereafter, erasing and rewriting data into individual ones of said plurality of groups of cells in accordance with such remapping.

22. A method of operating a mass storage system of a plurality of groups of EEPROM cells that have a lifetime of a maximum number of erase and rewrite cycles, comprising:

repeatedly erasing individual ones of said plurality of groups of cells and rewriting data into cells within the erased groups of cells by mapping externally supplied data addresses into addresses within the erased groups of cells, wherein said repeatedly erasing and rewriting includes not mapping data into a spare group of cells, and wherein remapping the externally supplied addresses includes mapping data into said spare group of cells while not mapping data into a group of cells having a highest count at the time of such remapping, maintaining a cumulative count of a number of erase and rewrite cycles experienced by individual ones of said plurality of groups of cells, calculating a quantity indicative of an extent of variation among the counts experienced by the plurality of groups of cells, comparing the calculated quantity with a preset threshold value, in response to said calculated quantity exceeding said preset threshold value and prior to an individual group attaining a maximum experience count equal to said lifetime, remapping the externally supplied data addresses in a manner to write data formerly directed to groups of cells with high counts to groups of cells with lower counts, thereby tending to reduce the extent of variation among the counts during future erase and rewrite cycles, and thereafter, erasing and rewriting data into individual ones of said plurality of groups of cells in accordance with such remapping.

23. A method of managing operation of a mass storage system having a plurality of banks of EEPROM cells, each bank including a plurality of blocks of EEPROM cells, the cells within each block being simultaneously erasable, comprising:

repeatedly subjecting individual ones of the plurality of said blocks of cells within said plurality of said banks to repeated erase and rewrite cycles in response to externally supplied addresses and data, maintaining a cumulative count of a number of erase and rewrite cycles to which the individual blocks of cells are subjected, averaging the cumulative counts of all of the plurality of blocks of cells within each of said banks, thereby generating an average experience count for each block, calculating a quantity indicative of an extent of variation among all of the average block experience counts, comparing said calculated quantity with a predetermined threshold variation value, and in response to said calculated quantity exceeding said predetermined threshold value and prior to any of the blocks reaching a limit of its endurance, redirecting the externally supplied addresses during subsequent erase and rewrite cycles in a manner that causes a reduction in the extent of variation among the average block experience counts, thereby to even out the use of the plurality of blocks.

24. A method of operating a mass storage system of a plurality of groups of EEPROM cells that have a lifetime of a maximum number of erase and rewrite cycles, comprising:

repeatedly erasing individual ones of said plurality of groups of cells and rewriting data into cells within the erased groups of cells, determining the physical addresses of cells within the erased groups of cells into which data is rewritten by converting externally supplied data addresses into physical EEPROM cell addresses according to an address mapping table, maintaining a cumulative count of a number of erase and rewrite cycles experienced by individual ones of said plurality of groups of cells, calculating a quantity indicative of an extent of variation among the experience counts of the plurality of groups of cells including one of said groups of cells having a higher experience count than the others of said groups of cells, comparing the calculated quantity with a preset threshold value, in response to said calculated quantity exceeding said preset threshold value and prior to an individual group of cells attaining a maximum experience count equal to said lifetime, moving data between groups of cells with high experience counts and groups of cells with lower experience counts, and changing the address mapping table in order to enable data formerly directed to said groups of cells with the higher experience counts to be written into said groups of cells with lower experience counts, thereby to reduce the extent of variation among the group experience counts during future erase and rewrite cycles, and thereafter, erasing and rewriting data into individual ones of said plurality of groups of cells in accordance with the change in the mapping table.

25. The method according to claim 24 wherein calculating a total number of group experience counts that the memory could accommodate if all of said groups of cells had the same experience count as said one group of cells, and wherein comparing the calculated quantity includes comparing the calculated total number of group experience counts with said preset threshold value.

26. The method according to claim 24 wherein the experience count variation calculating step includes identifying another of said groups of cells having a lower experience count than the others of said groups of cells, and wherein comparing the calculated quantity includes comparing a difference between the number of rewrite cycles of the groups of cells having the higher and lower experience counts with said preset threshold value.

27. The method according to claim 24 wherein moving data includes moving data between groups of cells which have previously been erased and had data rewritten into them, and changing the address mapping table includes enabling data to be written in groups of cells which have previously been erased and had data rewritten into them.

28. The method according to claim 24 wherein moving data includes moving data between a group of cells having a lowest experience count and a group of cells having a highest experience count, and changing the mapping table includes swapping addresses of those groups of cells having the lowest and highest experience counts.

29. A non-volatile memory system of a type having an array of EEPROM cells arranged in a plurality of separately addressable and erasable blocks of cells, comprising:

means responsive to receipt of sectors of data and unique logical addresses of the sectors for translating between said logical addresses and physical addresses of certain ones of said blocks of cells in which the sectors of data are stored, means monitoring either the logical addresses or the physical addresses of sectors of data being received for maintaining a cumulative count of a number of erase and rewrite cycles to which said blocks of cells have been individually subjected, means responsive to said count maintaining means for determining when an imbalance of a number of erase and rewrite cycle counts of individual blocks of memory cells exceeds a given threshold, means responsive to said given threshold being exceeded for transferring a sector of data from said at least one block of cells having the highest number of erase and rewrite cycles into at least one block of cells having the lowest number of erase and rewrite cycles, wherein the imbalance determining means includes:

means responsive to said cumulative count maintaining means for identifying a bank of said blocks having a highest number of erase and rewrite cycles, means responsive to said identifying means for determining a total number of erase and rewrite cycles that the array of EEPROM cells could accommodate if all of a plurality of banks of blocks had the same number of erase and rewrite cycles as said identified bank of blocks, and means responsive to said total number determining means and to said count maintaining means for comparing said total number with a number of erase and rewrite cycles to which all of said plurality of banks is actually subjected, and means responsive to said given threshold being exceeded prior to any of the individual blocks reaching an endurance limit for altering said translating means to redirect future data addressed to said at least one block having the highest number of erase and rewrite cycles to said at least one block having the lowest number of erase and rewrite cycles, thereby to even the wear on the blocks of cells and extend the life of the array of EEPROM cells.

30. A non-volatile memory system of a type having an array of EEPROM cells arranged in a plurality of separately addressable and erasable blocks of cells, comprising:

means responsive to receipt of sectors of data and unique logical addresses of the sectors for translating between said logical addresses and physical addresses of certain ones of said blocks of cells in which the sectors of data are stored, means monitoring either the logical addresses or the physical addresses of sectors of data being received for maintaining a cumulative count of a number of erase and rewrite cycles to which said blocks of cells have been individually subjected, means responsive to said count maintaining means for determining when a predetermined imbalance is reached among the maintained counts of the number of erase and rewrite cycles of individual blocks of cells including blocks within the array having the highest cycle count, and means responsive to said predetermined imbalance being reached and before any of the individual blocks of cells reaches an endurance limit for transferring existing sectors of data and redirecting future data sector writes among the blocks of cells including said blocks having the highest cycle count in a manner to more evenly distribute erase and rewrite cycles among the blocks of cells, whereby the life of the array of EEPROM cells is extended.

31. A non-volatile memory system of a type having an array of EEPROM cells arranged in a plurality of separately addressable and erasable blocks of cells, comprising:

means responsive to receipt of sectors of data and unique logical addresses of the sectors for translating between said logical addresses and physical addresses of certain ones of said blocks of cells in which the sectors of data are stored, means monitoring either the logical addresses or the physical addresses of sectors of data being received for maintaining a cumulative count of a number of erase and rewrite cycles to which said blocks of cells have been individually subjected, means responsive to said count maintaining means for determining when an imbalance of a number of erase and rewrite cycle counts of individual blocks of memory cells including at least one block within the array having the highest number of erase and rewrite cycles exceeds a given threshold, means responsive to said given threshold being exceeded for transferring a sector of data from said at least one block of cells having the highest number of erase and rewrite cycles into at least one block of cells having the lowest number of erase and rewrite cycles within the array, and means responsive to said given threshold being exceeded prior to any of the individual blocks reaching an endurance limit for altering said translating means to redirect future data addressed to said at least one block having the highest number of erase and rewrite cycles to said at least one block having the lowest number of erase and rewrite cycles, thereby to even the wear on the blocks of cells and extend the life of the array of EEPROM cells.

32. The memory system of claim 31 which additionally comprises means responsive to said given threshold being exceeded for transferring a sector of data from at least one block having the lowest number of erase and rewrite cycles into at least one spare block.

33. The memory system of either of claim 30 or 31 wherein the imbalance determining means includes:

means responsive to said count maintaining means for identifying a first bank of a plurality of said blocks having a higher number of erase and rewrite cycles than other banks of a plurality of said blocks, means responsive to said count maintaining means for identifying a second bank of a plurality of said blocks having a lower number of erase and rewrite cycles than other banks of a plurality of said blocks, and means receiving said first and second bank identifying means for determining whether a difference between the number of erase and rewrite cycles of said first and second banks exceeds a predetermined threshold.

* * * * *